(12) United States Patent
Heiman et al.

(10) Patent No.: US 8,156,397 B2
(45) Date of Patent: Apr. 10, 2012

(54) METHOD AND SYSTEM FOR FEEDBACK OF DECODED DATA CHARACTERISTICS TO A DECODER IN STORED DATA ACCESS AND DECODING OPERATIONS TO ASSIST IN ADDITIONAL DECODING OPERATIONS

(75) Inventors: Arie Heiman, Rannana (IL); Arkady Molev-Shteiman, Cliffwood, NJ (US)

(73) Assignee: Broadcom Corporation, Irvine, CA (US)

( * ) Notice: Subject to any disclaimer, the term of this patent is extended or adjusted under 35 U.S.C. 154(b) by 1128 days.

(21) Appl. No.: 11/971,319

(22) Filed: Jan. 9, 2008

(65) Prior Publication Data
US 2009/0055414 A1 Feb. 26, 2009

Related U.S. Application Data

(60) Provisional application No. 60/957,096, filed on Aug. 21, 2007.

(51) Int. Cl.
*H03M 13/00* (2006.01)
*H03M 13/03* (2006.01)
*G11C 29/00* (2006.01)
*G06F 11/00* (2006.01)
*H04L 12/28* (2006.01)

(52) U.S. Cl. ........ 714/746; 714/786; 714/794; 714/799; 714/821; 375/341; 370/241; 370/242

(58) Field of Classification Search .......... 714/746, 714/786, 799, 794, 821; 375/341; 370/241, 370/242
See application file for complete search history.

(56) References Cited

U.S. PATENT DOCUMENTS

| | | | | |
|---|---|---|---|---|
| 6,332,208 B1 * | 12/2001 | Aizawa | ............ | 714/786 |
| 6,967,598 B2 * | 11/2005 | Mills | ............ | 341/50 |
| 7,042,963 B1 * | 5/2006 | Raith et al. | ............ | 375/341 |
| 7,587,005 B2 * | 9/2009 | Tran | ............ | 375/341 |
| 7,706,481 B2 * | 4/2010 | Heiman et al. | ............ | 375/341 |
| 7,716,565 B2 * | 5/2010 | Heiman et al. | ............ | 714/795 |
| 7,877,673 B2 * | 1/2011 | Choi et al. | ............ | 714/784 |
| 2002/0110203 A1 * | 8/2002 | Sarkar | ............ | 375/341 |
| 2002/0159545 A1 * | 10/2002 | Ramesh et al. | ............ | 375/340 |
| 2006/0120488 A1 * | 6/2006 | Heiman et al. | ............ | 375/341 |
| 2007/0030926 A1 * | 2/2007 | Brown et al. | ............ | 375/340 |
| 2008/0034274 A1 * | 2/2008 | Song et al. | ............ | 714/796 |
| 2008/0049692 A1 * | 2/2008 | Bachu et al. | ............ | 370/338 |
| 2008/0123579 A1 * | 5/2008 | Kozat et al. | ............ | 370/312 |
| 2008/0240305 A1 * | 10/2008 | Koorapaty et al. | ............ | 375/341 |
| 2009/0239585 A1 * | 9/2009 | Huss | ............ | 455/561 |
| 2009/0268700 A1 * | 10/2009 | Son et al. | ............ | 370/336 |
| 2010/0020904 A1 * | 1/2010 | Tran | ............ | 375/341 |
| 2010/0182958 A1 * | 7/2010 | Hole | ............ | 370/329 |
| 2010/0223537 A1 * | 9/2010 | Heiman et al. | ............ | 714/795 |
| 2010/0281346 A1 * | 11/2010 | Choi et al. | ............ | 714/784 |

* cited by examiner

*Primary Examiner* — John J Tabone, Jr.
(74) *Attorney, Agent, or Firm* — Sterne, Kessler, Goldstein & Fox PLLC

(57) ABSTRACT

Aspects of a method and system for feedback of decoded data characteristics to decoder in stored data access and decoding operations to assist in additional decoding operations are presented. Aspects of the system may include a decoder that enables decoding of a portion of encoded data. A processor may enable generation of at least one hypothesis based on the decoded portion of encoded data and/or redundancy information associated with at least the decoded portion of the encoded data. The decoder may enable generation of one or more subsequent portions of decoded data based on the generated at least one hypothesis.

27 Claims, 4 Drawing Sheets

METHOD AND SYSTEM FOR FEEDBACK OF DECODED DATA CHARACTERISTICS TO A DECODER IN STORED DATA ACCESS AND DECODING OPERATIONS TO ASSIST IN ADDITIONAL DECODING OPERATIONS

CROSS-REFERENCE TO RELATED APPLICATIONS/INCORPORATION BY REFERENCE

This application makes reference to, claims priority to, and claims the benefit of U.S. Provisional Application Ser. No. 60/957,096 filed Aug. 21, 2007.

This application also makes reference to U.S. patent application Ser. No. 11/189,509 filed Jul. 28, 2005.

The above stated applications are hereby incorporated herein by reference in their entirety.

FIELD OF THE INVENTION

Certain embodiments of the invention relate to data communication. More specifically, certain embodiments of the invention relate to a method and system for feedback of decoded data characteristics to a decoder in stored data access and decoding operations to assist in additional decoding operations.

BACKGROUND OF THE INVENTION

In some communication networks, data may be transmitted and/or stored within data storage devices with redundancy information. Redundancy information may be utilized to determine the integrity of data received via the communication network, or retrieved from the storage device. Determination of data integrity may comprise a set of operations, which enable detection and/or correction of bit errors in the received data or retrieved data.

For example, the data may be transmitted within a packet, which may comprise a header, payload and/or trailer. The data may be contained within the payload, while redundancy information may be contained within the header and/or trailer. An example of redundancy information is a length field, which may indicate a length, as measured in octets, of the payload. Another example of redundancy information is a cyclic redundancy check (CRC) field. At a transmitter, the CRC may be computed for the bits contained in at least the payload based on a generator polynomial. The computed CRC value may be inserted in the header and/or payload of the packet. A receiver of the packet may utilize the CRC to determine whether there are bit errors in the received packet. In addition, the CRC may enable correction of detected bit errors in the received packet. The receiver may also utilize the length field to determine whether the length of the received payload is correct.

In many communication systems, the data contained within the payload is not raw data, but encoded raw data, or encoded data. Encoded data may be generated from raw data by utilizing forward error correction (FEC), for example. Within a transmitter, or other data encoding source device, encoded data may be generated from raw data by utilizing an encoding algorithm, such as one from the class of FEC code algorithms. Exemplary error correcting code algorithms include convolutional coding algorithms. Convolutional coding algorithms generate m bits of encoded data from n bits of raw data where typically m>n. The ratio n/m may be referred to as a coding rate for the convolutional coding algorithm. Thus, a total of N bits of raw data may be encoded to generate a total of M bits of encoded data within a payload. The M bits of encoded data may correspond to a payload length of M/8 octets, for example. The m bits of encoded data may comprise (m−n) bits of redundancy information that may be utilized at a receiver, or other data destination device, to detect and/or correct errors in received data or retrieved data. Prior to transmission, the encoded data bits may be modulated to form symbols. Each symbol may be a representation of one or more encoded data bits. For example, with 8 phase shift keying (8-PSK) modulation, each symbol may represent 3 encoded data bits. The transmitted signals may comprise a plurality of symbols.

At a receiver the received symbols may be demodulated to recover at least estimated values for the encoded data, which was modulated by the transmitter, or other data source device. The demodulation method used at the receiver, or other data destination device, typically corresponds to the modulation method used at the transmitter, or other data source device. For example, if a transmitter modulated encoded data utilizing 8-PSK modulation, a receiver may demodulate the received signals utilizing 8-PSK demodulation.

At a receiver, or other data destination device, the encoded data may be decoded to extract at least estimates of the binary values contained in the raw data, which was previously processed within the transmitter, or other data source device, to generate the encoded data. Within the receiver, or other data destination device, a decoding algorithm may be utilized to generate the estimated raw data from the estimated encoded data. Exemplary decoding algorithms include the Viterbi algorithm, maximum likelihood sequence estimation (MLSE) and the maximum a posteriori probability (MAP) algorithm. The application of the Viterbi algorithm to estimated encoded data may be referred to as Viterbi decoding.

With Viterbi decoding, a set of logic states is defined wherein each potential symbol value corresponds to one of the logical states. Then a state transition diagram is defined for a set of time instants within a time window, wherein each time instant corresponds to reception of, or retrieval of, a symbol. The state transition diagram specifies which subsequent states are possible at a succeeding time instant given a current state and a current time instant. Each state transition may be referred to as an arc. An estimated value for a subsequent received symbol is compared with the values corresponding to each of the subsequent states. The comparison is typically a computed Hamming distance, or Euclidean distance, between the estimated symbol value and each state value, for example. The comparison may be based on computed Euclidean distances when the symbol values have not been demodulated, such as in soft-decision decoding. The comparison may be based on computed Hamming distances when symbol values have been demodulated, such as in hard-decision decoding. Each comparison may enable computation of an error metric. Consequently, each arc may be associated with a corresponding error metric.

Across the span of a time window, from the first time instant to the last time instant, a plurality of state transition arcs may be defined. Each arc may define a distinct set of state transitions across the span of the time window. Associated with each arc is an aggregated error metric, which is computed as a sum of the error metrics at each time instant along the arc. Among the plurality of state transition arcs, a state transition arc, which has the lowest aggregated error metric value, may be selected. The selected state transition arc may be utilized to derive the estimated raw data.

MLSE decoding is similar to Viterbi decoding, however, with MLSE decoding, an error metric is computed for the state transition arc from each state at a current time instant, to each state at a succeeding time instant. Thus, for a state transition diagram in which there are four defined states, a total of 16 arcs may be defined for each time instant, for which a corresponding 16 error metrics may be computed. A state transition arc across the time window may be constructed by selecting a state at each time instant, which is associated with the minimum error metric at that time instant. In this regard, MLSE decoding may be considered to be a brute-force computational alternative to Viterbi decoding.

With MAP decoding, each subsequent state transition is considered to be a random variable, such as may be computed in Bayesian statistics, wherein the likelihood of a succeeding state transition, following a current time instant, may be determined after making observations of preceding state transitions.

After decoding the received, or retrieved, symbols to derive raw data, the redundancy information in the packet header and/or trailer may then be utilized to determine the integrity of the decoded data. The length field, for example, may be utilized to determine whether the length of the decoded data field is correct. The CRC may be utilized to determine whether there are bit errors in the decoded data.

One limitation associated with the redundancy information is that while the redundancy information may enable detection of bit errors in the decoded data, it may not enable correction of the bit errors. Consequently, an inability to correct detected bit errors in received, or retrieved, packets may result in lost data if the received, or retrieved, packet is discarded due to the detected error(s).

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for feedback of decoded data characteristics to a decoder in stored data access and decoding operations to assist in additional decoding operations, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for feedback of decoded data characteristics to a decoder in stored data access and decoding operations to assist in additional decoding operations. In various embodiments of the invention, redundancy information may be identified in received, or retrieved, packets. The redundancy information may comprise, but is not limited to, length fields and/or cyclic redundancy check (CRC) fields. The encoded data contained within the packet payload field may be decoded. If the redundancy information detects uncorrectable errors within the decoded data, a first junction point may be selected within the decoded data. The first junction point may identify a first portion of decoded data. From this junction point, first hypothesis decoded data may be generated. The combined first portion of decoded data and first hypothesis data may be evaluated based on the redundancy information. If the redundancy information does not indicate detection of uncorrectable errors, the decoded data may be derived from the combined first portion of decoded data and first hypothesis data. If the redundancy information indicates the detection of uncorrectable errors, one or more additional junction points may be identified with corresponding hypothesis data generated. In various embodiments of the invention, the process or junction point identification, hypothesis data generation, and redundancy information verification may continue until a combination of decoded data portions are generated such that the redundancy information does not detect uncorrectable errors.

Figure 1:
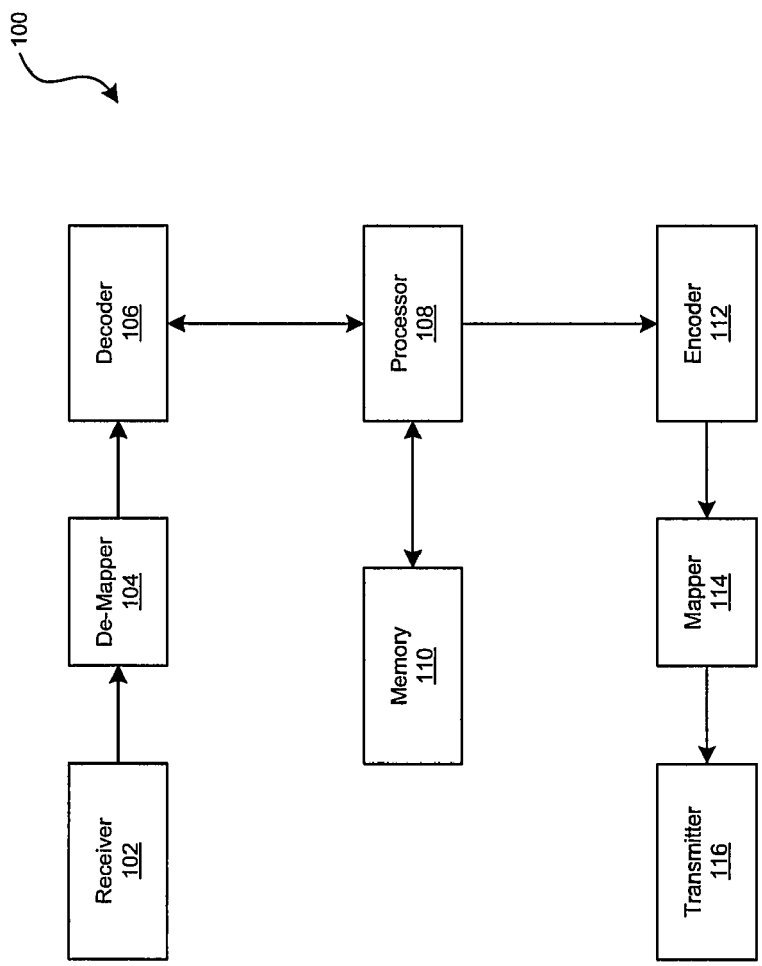
FIG. 1 is an exemplary transceiver, which may be utilized in connection with an embodiment of the invention.

FIG. 1 is an exemplary transceiver, which may be utilized in connection with an embodiment of the invention. Referring to FIG. 1, there is shown a transceiver system 100. The transceiver system 100 may comprise at least a receiver 102, a de-mapper 104, a decoder 106, a processor 108, a memory 110, an encoder 112, a mapper 114 and a transmitter 116. Although a transceiver is shown in FIG. 1, transmit and receive functions may be separately implemented.

The receiver 102 may comprise suitable logic, circuitry, and/or code that may enable processing of received RF signals within one or more distinct frequency ranges. The receiver 102 may enable reception of RF signals in frequency bands utilized by various wireless communication systems, such as WLAN, Bluetooth, GSM and/or CDMA, for example. The receiver 102 may receive an analog RF signal within a given frequency band, and subsequently downconvert the RF signal to generate a digital baseband signal, for example. The digital baseband signal may comprise a sequence of symbol values at distinct time instants.

The de-mapper 104 may comprise suitable logic, circuitry and/or code that may enable conversion of a symbol value to a binary representation. The de-mapper 104 may convert the symbol value to a binary representation comprising one or more bits by utilizing a suitable demodulation type. The de-mapper 104 may output the binary representation, in addition to information related to the received symbol value.

The decoder 106 may comprise suitable logic, circuitry and/or code that may enable generation of decoded binary data based on received binary encoded data and/or received symbol value data. The decoder 106 may generate the decoded binary data by utilizing one or more suitable decoding algorithms, such as Viterbi decoding, MLSE and/or MAP. The decoder 106 may utilize received binary encoded data to perform hard-decision decoding, and/or information related to a received symbol value corresponding to the binary encoded data to perform soft-decision decoding.

The processor 108 may comprise suitable logic, circuitry and/or code, which, in the context of the present application, may enable generation of hypotheses in connection with decoding of data. The processor 108 may enable data, which is decoded based on the hypotheses, to be evaluated for data integrity based on redundancy information.

The memory 110 may comprise suitable logic, circuitry and/or code that may enable storage and/or retrieval of data and/or code. The memory 110 may utilize any of a plurality of storage medium technologies, such as volatile memory, for example random access memory (RAM), and/or non-volatile memory, for example electrically erasable programmable read only memory (EEPROM). In the context of the present application, the memory 110 may enable storage of code and/or data that enables hypothesis-based decoding of data, with evaluation of the decoded data based on redundancy information.

The encoder 112 may comprise suitable logic, circuitry and/or code that may enable generation of encoded binary data based on received raw data. The encoded binary data may comprise redundant bits, which enable detection and/or correction of bit errors within the encoded binary data. The encoder 112 may generate the encoded binary data by utilizing one or more suitable encoding algorithms, such as binary convolutional coding (BCC).

The mapper 114 may comprise suitable logic, circuitry and/or code that may enable conversion of a binary representation, comprising one or more bits, into a symbol value. The mapper 114 may generate a signal, which comprises an In-phase (I) component of the symbol value and a Quadrature-phase (Q) component. The generated signal may be a digital baseband signal.

The transmitter 116 may comprise suitable logic, circuitry, and/or code that may enable generation of RF signals within one or more distinct frequency ranges. The receiver 102 may enable generation of RF signals in frequency bands utilized by various wireless communication systems, such as WLAN, Bluetooth, GSM and/or CDMA, for example. The receiver 102 may receive digital baseband signal, and subsequently upconvert the digital baseband signal to an analog RF signal, for example.

In operation, the transceiver system 100 may receive packets via a wireless communication medium. The receiver 102 may receive an RF signal via a wireless communication medium. The receiver 102 may downconvert the RF signal to a digital baseband signal. The digital baseband signal may comprise a series of symbols. A collection of symbols may form a received packet. The packet may comprise a header portion, payload portion and trailer portion. The de-mapper 104 may convert a symbol value associated with each of the symbols to a corresponding binary representation comprising a plurality of bits. The de-mapper 104 may also generate information which may be utilized by the decoder 106 to perform soft-decision decoding. The decoder 106 may decode the data received from the de-mapper 104. During the decoding process, the decoder 106 may identify a set of junction points along a selected state transition arc, wherein each junction point may correspond to different time instants, which may mark progress in the decoding of the packet. Junction points may be selected based on criteria, such as computed error metrics. After decoding the payload portion of the received packet, the decoder 106 may utilize redundancy information contained in the header and/or trailer portion of the packet to determine whether uncorrectable errors have been detected in the decoded payload portion of the packet.

In various embodiments of the invention, when an uncorrectable error has been detected, the processor 108 may generate one or more hypotheses. The processor 108 may select a junction point from the state transition arc computed by the decoder 106. The processor 108 may then instruct the decoder 106 to rollback the decoding process to the selected junction point. The rollback operation may identify a portion of decoded data. The processor 108 may compute hypothesis redundancy information, for example a partial CRC value, which corresponds to the portion of decoded data. Based on the CRC field, and the partial CRC value, the processor 108 may generate at least one hypothesis. The hypothesis may comprise generation of a set of bits, which may be appended to the portion of decoded data to generate new decoded data.

Based on the new decoded data, at least a portion of the redundancy information, for example the CRC field, may not detect any uncorrectable bit errors in the new decoded data. Additional redundancy information, for example a length field, may be utilized to determine whether there may be bit errors in the new decoded data. If no uncorrectable errors are detected, the decoded packet may be accepted at the transceiver system 100. Once accepted, the decoded packet may be stored in the memory 110.

When uncorrectable bit errors are detected in the new decoded data, the processor 108 may iteratively repeat the process by selecting another junction point, computing subsequent new decoded data, and utilizing the redundancy information to determine the data integrity of the subsequent new decoded data.

Figure 2:
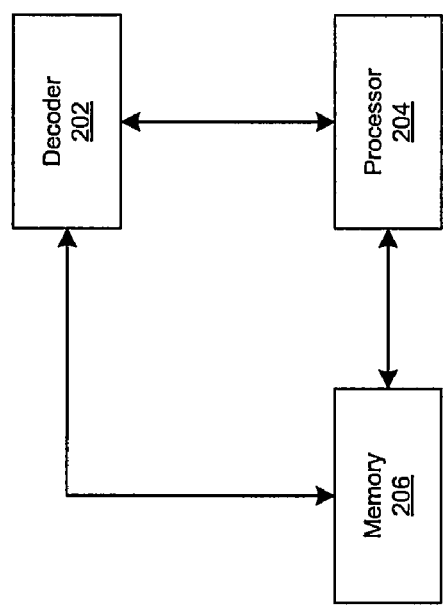
FIG. 2 is an exemplary data storage system, which may be utilized in connection with an embodiment of the invention.

FIG. 2 is an exemplary data storage system, which may be utilized in connection with an embodiment of the invention. Referring to FIG. 2, there is shown a data storage system 200. The data storage system 200 may comprise at least a decoder 202, a processor 204 and a memory 206. The data storage system 200 may differ from the transceiver system 100 in that the data storage system 200 may receive encoded data from a local or network accessible storage media device, such as a disk drive. The decoder 202 may be substantially similar to the decoder 106 (FIG. 1). The decoder 202 may perform hard-decision decoding. The memory 206 may be substantially similar to the memory 110. The memory 206 may also comprise magnetic disk storage media and/or optical storage media.

In operation the processor 204 may enable retrieval of encoded data from the memory 206. The memory 206 may comprise data storage resources, which may be locally accessible to the processor 204 via a local or system bus, or the memory 206 may comprise data storage resources, which may be accessible via a network, such as in a storage area network (SAN) configuration. The encoded data may be contained in packets.

The retrieved encoded data may be sent to the decoder 202, which may decode the encoded data to derive decoded data. The decoder 202 may decode the encoded data utilizing a method substantially similar to the decoder 106. In various embodiments of the invention, the processor 204 and decoder 202 may interact to enable selection of junction points, computing of new decoded data, and utilizing of redundancy information contained in the retrieved packets to determine the data integrity of the decoded data, in a manner substantially similar to that described for the processor 108 and decoder 106.

Figure 3:
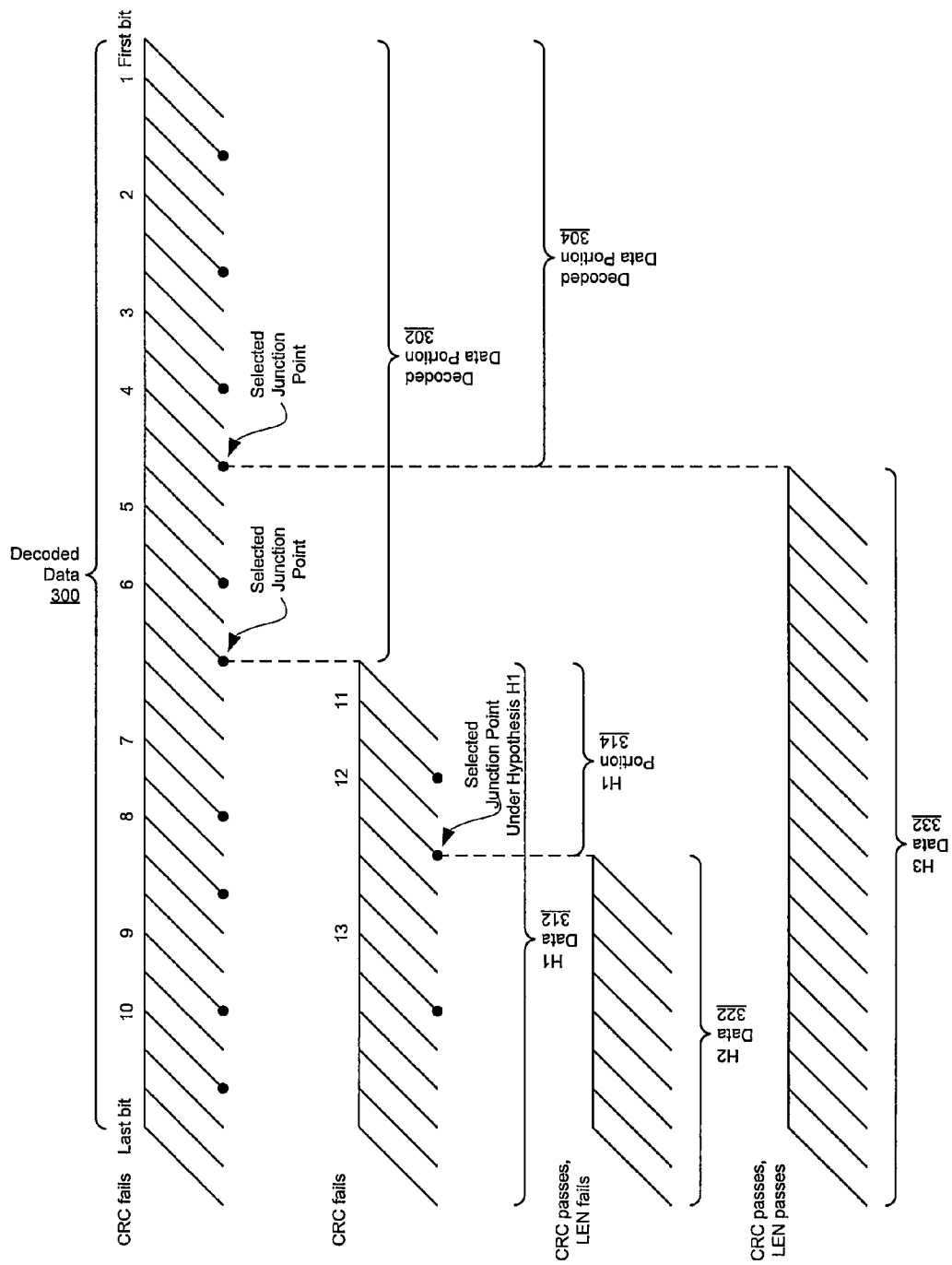
FIG. 3 is diagram illustrating exemplary decoding of data based on redundancy information with generation of alternative hypotheses, in accordance with an embodiment of the invention.

FIG. 3 is diagram illustrating exemplary decoding of data based on redundancy information with generation of alternative hypotheses, in accordance with an embodiment of the invention. Referring to FIG. 3, the decoder 106 may receive a packet and generate decoded data 300. In an exemplary embodiment of the invention, the decoded data 300 may be generated based on Viterbi decoding. During the process of generating the decoded data 300, 10 junction points may be identified. The junction points are labeled 1-10 in the decoded data 300. The junction points may refer to time instants along a selected state transition arc, which may be generated during the decoding process. An error metric may be associated with each junction point.

The CRC field contained within the received packet may indicate the detection uncorrectable bit errors in the decoded data 300. The processor 108 may select one of the junction points based on computed error metrics, for example. In the exemplary decoding process illustrated in FIG. 3, junction point 6 is selected. The selection of junction point 6 may identify a decoded data portion 302, which may correspond to data decoded from the first bit in the decoded data 300, to the bit decoded at junction point 6. A partial CRC, $CRC_{p1}$, may be computed corresponding to the decoded data portion 302. Based on the packet CRC, $CRC_{pkt}$, and the partial CRC, $CRC_{p1}$, hypothesis H1 data, H1 data 312, may be generated. New decoded data may be generated by combining the decoded data portion 302 and the H1 data 312.

If the packet CRC field, $CRC_{pkt}$, indicates the detection of uncorrectable bit errors in the new decoded data, generated by combining 302 and 312, the processor 108 may select one of the junction points under hypothesis H1, H1 data 312. In FIG. 3, the junction points under H1 data 312 are labeled 11-13. In the exemplary decoding process illustrated in FIG. 3, junction point 12 is selected. The selection of junction point 12 may identify an H1 portion 314, which may correspond to data decoded from the first bit decoded under hypothesis H1, to the bit decoded at junction point 12 under the hypothesis H1. A partial CRC, $CRC_{p2}$, may be computed corresponding to the decoded data portion 302 and H1 portion 314. Based on the CRC, $CRC_{pkt}$, and the partial CRC, $CRC_{p2}$, hypothesis H2 data, H2 data 322, may be generated. New decoded data may be generated by combining the decoded data portion 302, H1 portion 314, and H2 data 322.

If the packet CRC, $CRC_{pkt}$, does not indicate the detection of uncorrectable bit errors in the new decoded data, generated by combining 302, 314 and 322, the processor 108 may validate the new decoded data against the packet length field, $LEN_{pkt}$. If the length of the new decoded data does not correspond to the length field, $LEN_{pkt}$, the processor 108 may determine whether there are additional junction points to be tested under hypothesis H1.

If the processor 108 determines that there are no further junction points to test under hypothesis H1, the processor may select another junction point in the decoded data 300. In the exemplary decoding process illustrated in FIG. 3, junction point 4 is selected. The selection of the junction point 4 may identify a decoded data portion 304. A partial CRC, $CRC_{p3}$, may be computed corresponding to the decoded data portion 304. Based on the packet CRC, $CRC_{pkt}$, and the partial CRC, $CRC_{p3}$, hypothesis H3 data, H3 data 332, may be generated. New decoded data may be generated by combining data portion 304 and the H3 data 332.

If the packet CRC field, $CRC_{pkt}$, does not indicate the detection of uncorrectable bit errors in the new decoded data, generated by combining 304 and 332, the processor 108 may validate the new decoded data against the packet length field, $LEN_{pkt}$. If the length of the new decoded data corresponds to the length field, $LEN_{pkt}$, the processor 108 may accept the decoded packet.

Figure 4:
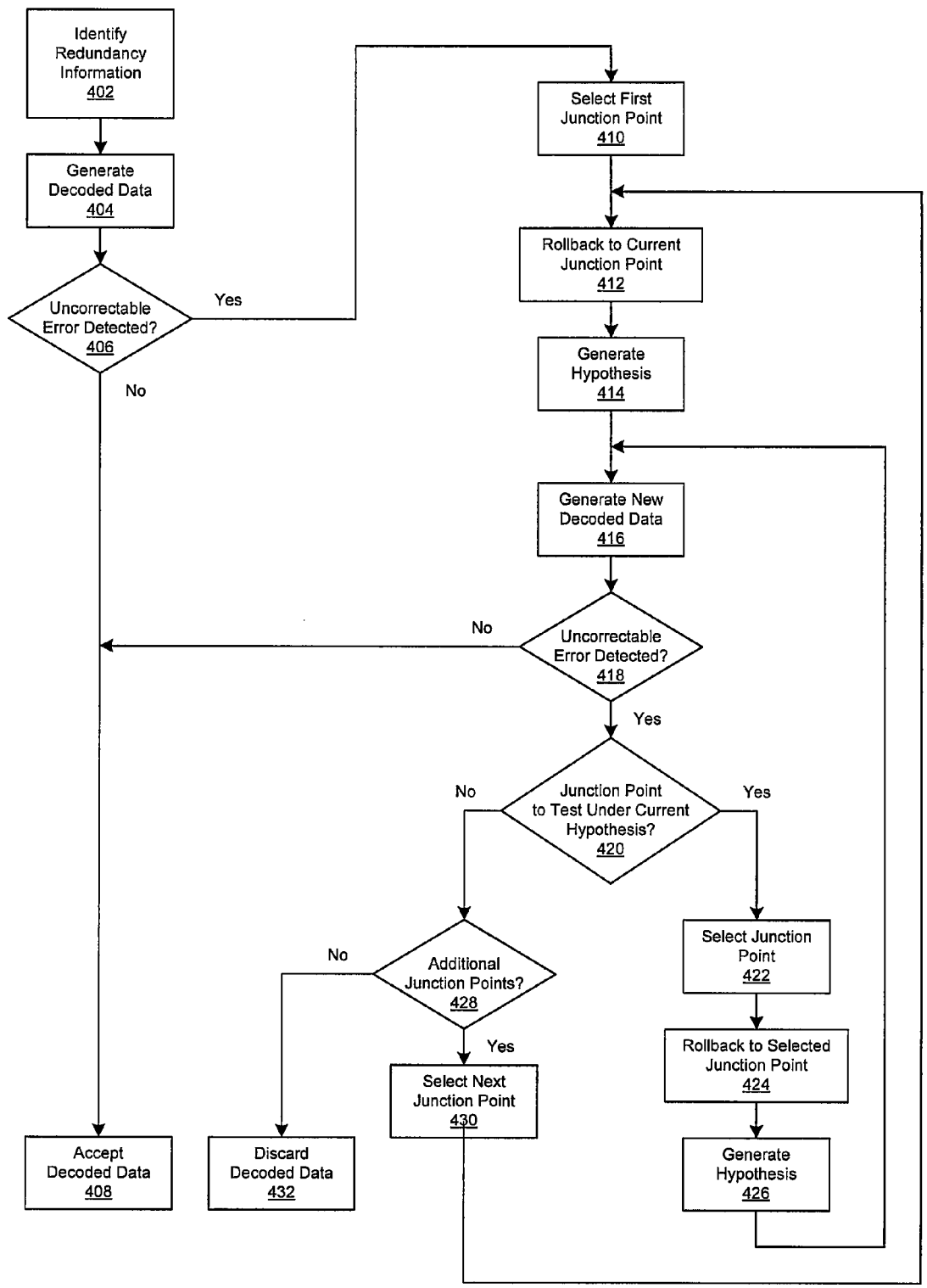
FIG. 4 is a flowchart illustrating exemplary steps for decoding of data based on redundancy information with generation of alternative hypotheses, in accordance with an embodiment of the invention.

FIG. 4 is a flowchart illustrating exemplary steps for decoding of data based on redundancy information with generation of alternative hypotheses, in accordance with an embodiment of the invention. Referring to FIG. 4, in step 402, the processor 108 may identify redundancy information within a received packet. In various embodiments of the invention, the redundancy information may include, but may not be limited to, a length field and a CRC field. In step 404, the decoder 106 may generate decoded data 300. In step 406, redundancy information may be utilized to determine whether uncorrectable bit errors have been detected in the decoded data 300. If no uncorrectable bit errors are detected in step 406, the decoded data 300 may be accepted in step 408.

If uncorrectable bit errors are detected in step 406, in step 410 a first junction point in the decoded data 300 may be selected. In step 412, the processor 108 may instruct the decoder 106 to rollback decoding to the current selected junction point. In step 414, a hypothesis H1 may be generated. In step 416, new decoded data, 302 and 312, may be generated. In step 418, redundancy information may be utilized to determine whether uncorrectable bit errors have been detected in the new decoded data generated in step 416. If no uncorrectable bit errors are detected in step 418, the decoded data, 302 and 312, may be accepted in step 408.

If uncorrectable bit errors are detected in step 418, step 420 may determine whether there are additional junction points to test under the current hypothesis. If in step 420 it is determined that there may be no more junction points to test under the current hypothesis, step 428 may determine whether there are additional junction points to test in the decoded data 300. If in step 428 it is determined that there may be no more junction points to test in the decoded data 300, the decoded data may be discarded in step 432. If in step 428 it is determined that there may be additional junction points to test in the decoded data 300, a next junction point may be selected in step 430. Step 412 may follow step 430.

If in step 420 it is determined that there may be additional junction points to test under the current hypothesis, in step 422, a next junction point under the current hypothesis, H1, may be selected. In step 424, the processor 108 may instruct the decoder 106 to rollback decoding to the selected junction point within H1 data 312. In step 426 a hypothesis H2 may be generated. Step 416 may follow step 426.

Aspects of a method and system for feedback of decoded data characteristics to decoder in stored data access and decoding operations to assist in additional decoding operations may comprise a decoder 106 that enables decoding of a portion of encoded data. A processor 108 may enable generation of at least one hypothesis based on the decoded portion of encoded data and/or redundancy information associated with at least the decoded portion of the encoded data. The decoder 106 may enable generation of one or more subsequent portions of decoded data based on the generated at least one hypothesis.

The decoder 106 may enable generation of a block of decoded data by combining the decoded portion of encoded data and one or more of the generated subsequent portions of decoded data. The processor 108 may enable computation of one or more validation metrics based on the generated block of decoded data. The computed one or more validation metrics may comprise a length value and/or a cyclic redundancy check (CRC) value. The processor 108 may enable comparison of the computed one or more validation metrics and the redundancy information. The memory 110 may enable storage of the generated block of decoded data based on the comparison. The processor 108 may enable generation of one or more subsequent blocks of decoded data based on the comparison.

The decoder 106 may enable generation of the one or more subsequent blocks of decoded data by enabling combination of: a) the decoded portion of the encoded data or a subsequent decoded portion of the encoded data; and b) at least a portion of the one or more subsequent portions of decoded data and/or one or more generated subsequent portions of decoded data. The decoder 106 may enable generation of the one or more generated subsequent portions of decoded data based on a subsequent generated at least one hypothesis. The processor 108 may enable computation of one or more subsequent validation metrics based on the generated one or more subsequent blocks of decoded data. The processor 108 may enable comparison of the one or more subsequent validation metrics and the redundancy information. The memory 110 may enable storage of the generated one or more subsequent blocks of decoded data based on the comparison.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in a communication system, the method comprising:
   decoding a plurality of bits;
   selecting a first portion of said decoded plurality of bits when one or more bit errors are detected in said decoded plurality of bits;
   generating a first hypothesis for the remaining bits of said decoded plurality of bits that are not part of said selected first portion, said generation being based on redundancy information computed for said selected first portion and on redundancy information corresponding to said plurality of bits;
   selecting a second portion of said decoded plurality of bits when said generated first hypothesis does not validate said decoded plurality of bits, said second portion comprising said selected first portion and one or more bits of said remaining bits of said decoded plurality of bits; and
   generating a second hypothesis for the remaining bits of said decoded plurality of bits that are not part of said selected second portion, said generation being based on redundancy information computed for said selected second portion and on redundancy information corresponding to said plurality of bits.

2. The method according to claim 1, comprising generating a block of decoded data by combining said selected first portion of said decoded plurality of bits and said generated first hypothesis.

3. The method according to claim 2, comprising computing one or more validation metrics based on said generated block of decoded data.

4. The method according to claim 3, wherein said computed one or more validation metrics comprises one or both of a length value and a cyclic redundancy check value.

5. The method according to claim 3, comprising comparing said computed one or more validation metrics and said redundancy information.

6. The method according to claim 5, comprising storing said generated block of decoded data based on said comparing.

7. The method according to claim 5, comprising generating one or more subsequent blocks of decoded data based on said comparing.

8. The method according to claim 7, comprising generating said one or more subsequent blocks of decoded data by combining:
   said selected first portion;
   a portion of said first hypothesis; and
   at least a portion of said second hypothesis.

9. The method according to claim 7, comprising computing one or more subsequent validation metrics based on said generated one or more subsequent blocks of decoded data.

10. The method according to claim 9, comprising comparing said one or more subsequent validation metrics and said redundancy information.

11. The method according to claim 10, comprising storing said generated one or more subsequent blocks of decoded data based on said comparing.

12. The method according to claim 1, wherein said redundancy information comprises one or both of a length value and a cyclic redundancy check value.

13. A system for processing signals in a communication system, the system comprising:
   one or more circuits that enable decoding a plurality of bits;
   said one or more circuits enable selecting a first portion of said decoded plurality of bits when one or more bit errors are detected in said decoded plurality of bits;
   said one or more circuits enable generation of a first hypothesis for the remaining bits of said decoded plurality of bits that are not part of said selected first portion, said generation being based on redundancy information computed for said selected first portion and on redundancy information corresponding to said plurality of bits; and
   said one or more circuits enable selection of a second portion of said decoded plurality of bits when said generated first hypothesis does not validate said decoded plurality of bits, said second portion comprising said selected first portion and one or more bits of said remaining bits of said decoded plurality of bits; and
   said one or more circuits enable generation of a second hypothesis for the remaining bits of said decoded plurality of bits that are not part of said selected second portion, said generation being based on redundancy information computed for said selected second portion and on said redundancy information corresponding to said plurality of bits.

14. The system according to claim 13, wherein said one or more circuits enable generation of a block of decoded data by combining said selected first portion and said generated first hypothesis.

15. The system according to claim 14, wherein said one or more circuits enable computation of one or more validation metrics based on said generated block of decoded data.

16. The system according to claim 15, wherein said computed one or more validation metrics comprises one or both of a length value and a cyclic redundancy check value.

17. The system according to claim 15, wherein said one or more circuits enable comparison of said computed one or more validation metrics and said redundancy information.

18. The system according to claim 17, wherein said one or more circuits enable storage of said generated block of decoded data based on said comparison.

19. The system according to claim 17, wherein said one or more circuits enable generation of one or more subsequent blocks of decoded data based on said comparison.

20. The system according to claim 19, wherein said one or more circuits enable generation of said one or more subsequent blocks of decoded data by enabling combination of:
   said selected first portion;
   a portion of said first hypothesis; and
   at least a portion of said second hypothesis.

21. The system according to claim 19, wherein said one or more circuits enable computation of one or more subsequent validation metrics based on said generated one or more subsequent blocks of decoded data.

22. The system according to claim 21, wherein said one or more circuits enable comparison of said one or more subsequent validation metrics and said redundancy information.

23. The system according to claim 22, wherein said one or more circuits enable storage of said generated one or more subsequent blocks of decoded data based on said comparison.

24. The system according to claim 13, wherein said redundancy information comprises one or both of a length value and a cyclic redundancy check value.

25. The system according to claim 13, wherein said one or more circuits comprise at least a processor, memory and a decoder.

26. A system for processing signals in a communication system, the system comprising:
   one or more circuits that are operable to:
   detect one or more bit errors in a plurality of decoded bits;
   select a first portion of said plurality of decoded bits and determine a first hypothesis for the remaining bits of said plurality of decoded bits that are not part of said selected first portion, said determination being based on redundancy information computed for said selected first portion of said plurality of decoded bits and on redundancy information corresponding to said plurality of decoded bits; and
   when said first hypothesis does not validate said plurality of decoded bits, select a first portion of said first hypothesis and determine a second hypothesis for the remaining bits of said first hypothesis that are not part of said selected first portion of said first hypothesis, said determination being based on redundancy information corresponding to said plurality of decoded bits and on redundancy information computed for a combination of said selected first portion of said plurality of decoded bits and said selected first portion of said first hypothesis.

27. The system according to claim 26, wherein said one or more circuits are operable to:
   when said second hypothesis does not validate said plurality of decoded bits, select a first portion of said second hypothesis and determine a third hypothesis for the remaining bits of said second hypothesis that are not part of said selected first portion of said second hypothesis, said determination being based on redundancy information corresponding to said plurality of decoded bits and on redundancy information computed for a combination of said selected first portion of said plurality of decoded bits, said selected first portion of said first hypothesis, and said selected first portion of said second hypothesis.

* * * * *